(12) United States Patent
Fairbanks et al.

(10) Patent No.: US 7,908,531 B2
(45) Date of Patent: Mar. 15, 2011

(54) NETWORKED TEST SYSTEM

(75) Inventors: Stephen R. Fairbanks, Worcester, MA (US); Eric L. Truebenbach, Sudbury, MA (US)

(73) Assignee: Teradyne, Inc., North Reading, MA (US)

( * ) Notice: Subject to any disclaimer, the term of this patent is extended or adjusted under 35 U.S.C. 154(b) by 762 days.

(21) Appl. No.: 11/540,812

(22) Filed: Sep. 29, 2006

(65) Prior Publication Data

US 2008/0098272 A1    Apr. 24, 2008

(51) Int. Cl.
   *G01R 31/28*         (2006.01)
   *G01R 31/30*         (2006.01)
(52) U.S. Cl. ........................................ 714/724; 714/745
(58) Field of Classification Search .................. 714/718, 714/724, 733, 734, 47, 712; 324/158.1, 765, 324/73.1; 365/201; 709/224; 341/126–172
See application file for complete search history.

(56) References Cited

U.S. PATENT DOCUMENTS

| | | | | |
|---|---|---|---|---|
| 5,638,383 | A * | 6/1997 | Wotzak et al. | 714/733 |
| 5,991,537 | A * | 11/1999 | McKeon et al. | 717/115 |
| 6,028,439 | A * | 2/2000 | Arkin et al. | 324/765 |
| 6,058,260 | A * | 5/2000 | Brockel et al. | 703/4 |
| 6,107,818 | A * | 8/2000 | Czamara | 324/765 |
| 6,591,385 | B1 * | 7/2003 | Krech et al. | 714/718 |
| 6,779,140 | B2 * | 8/2004 | Krech et al. | 714/718 |
| 2005/0102580 | A1 | 5/2005 | House | |
| 2005/0163272 | A1 * | 7/2005 | Payne et al. | 375/354 |
| 2005/0193298 | A1 | 9/2005 | Inaba et al. | |
| 2008/0010568 | A1 * | 1/2008 | Kushnick | 714/724 |

FOREIGN PATENT DOCUMENTS

| | | |
|---|---|---|
| WO | WO 99/23499 A1 | 5/1999 |
| WO | WO 2005/078465 A | 8/2005 |

OTHER PUBLICATIONS

Invitation to Pay Additional Fees and Partial International Search mailed Mar. 25, 2008 for International Application No. PCT/US2007/020297.
Rajsuman, "An Overview of the Open Architecture Test System," *Proceedings of the Second IEEE International Workshop on Electronic Design*, pp. 1-6.
International Search Report and Written Opinion mailed Jun. 17, 2008 for International Application No. PCT/US2007/020297 (16 pages).
International Preliminary Report on Patentability mailed Apr. 9, 2009 for International Application No. PCT/US2007/020297 (8 pages).

* cited by examiner

*Primary Examiner* — Cynthia Britt
*Assistant Examiner* — Daniel F McMahon
(74) *Attorney, Agent, or Firm* — Wolf, Greenfield & Sacks, P.C.

(57) ABSTRACT

An automatic test system that can be configured to perform any of a number of test processes. The test system contains multiple functional modules that are interconnected by a network. By using software to configure data flow between functional modules, combinations of modules can be made, thereby creating virtual instruments. As test requirements change, the test system can be reconfigured to contain other virtual instruments, eliminating or reducing the need to add instruments to meet changing test requirements. To ensure adequate performance of the test system, a proposed configuration may be simulated, and if a virtual instrument does not provide a required level of performance, the test system may be reconfigured.

23 Claims, 5 Drawing Sheets

FIG. 5

NETWORKED TEST SYSTEM

BACKGROUND OF INVENTION

1. Field of Invention

This invention relates generally to electronic assemblies and more specifically to testing electronic assemblies.

2. Discussion of Related Art

A need to test electronic assemblies frequently arises in connection with the manufacture or repair of electronic systems. An assembly may be tested by applying a pattern of stimulus signals to the assembly and comparing signals generated in response to an expected pattern of signals. In complex systems, numerous stimulus signals may be applied to an assembly and numerous response signals be measured during a test. To perform testing in an acceptable period of time, automatic test equipment is frequently used. The automatic test equipment can be programmed to quickly generate stimulus signals in a desired pattern and compare the response signals to an expected pattern.

To be able to generate and measure test signals of many different forms, test systems are frequently constructed with multiple instruments. Each instrument may execute a process that is a part of a full test. Frequently, the test processes executed by instruments include generation of stimulus signals, measurement of response signals and processing that either defines the stimulus signals or analyzes the responses. For example, a digital instrument may be programmed to generate a sequence of digital values at a test point of a unit under test ("UUT") and measure one or more digital responses. The digital instrument may then analyze the responses to determine whether the UUT responded as expected to the stimulus signals.

One or more analog instruments may also be included in the test system, with each instrument generating or measuring an analog signal. For example, one analog instrument may act as a digital meter outputting a value that represents a voltage at a test point of a UUT. Another analog instrument may act as a scope, capturing samples of an analog signal at a test point and graphically displaying a representation of that signal. Yet other analog instruments may act as timing triggers, identifying a programmed pattern of signals and outputting an indication when that pattern is detected.

Each test system may include multiple instruments, with the specific instruments incorporated in the test system depending on the characteristics of units expected to be tested with that test system. The instruments may operate in a coordinated fashion under control of circuitry that is programmed to control the instruments to collectively perform any desired test. Outputs from the instruments may be passed to a processing element that determines from individual instruments whether the UUT is functioning, or, if the UUT is defective, determines the nature of the defect.

Many test facilities, whether operated for maintenance or manufacture of units, test multiple types of units with tests including different processes. Accordingly, a test system may be configured with more instruments than needed to test a single unit so that as test needs are identified, instruments needed to perform all processes of any test will be available. A downside of such an approach is the cost of procuring multiple instruments is incurred.

SUMMARY OF INVENTION

An improved test system is provided with multiple functional modules that can be assembled into virtual instruments that perform processes of physical instruments. Each functional module may perform a function that is part of a process performed by a virtual instrument. The functional modules may be interconnected by a network, allowing data to be exchanged between the functional modules. By appropriately interconnecting the functional modules, the test system may generate, measure and analyze test signals as in a conventional test system. However, the functional modules can be reconfigured to be a part of multiple different virtual instruments at different times, reducing the aggregate amount of hardware needed to implement a large number of instruments. Further, in any given configuration, the output of a functional module may be provided as an input to more than one other functional module. In this way, one functional module may replace multiple copies of functional circuitry in multiple physical instruments, thereby further reducing the total hardware required.

To provide a desired level of performance for the overall test system, the test system may be configured by specifying connection characteristics of the network interconnecting the functional modules to ensure the network reliably carries data between functional modules forming a virtual instrument. Further, a user may select between functional modules that perform similar functions, but with different levels of performance, to further alter the performance of the virtual instruments.

In one aspect, the invention relates to an automatic test system for testing a UUT. The test system includes a network and at least one first functional module that interfaces to the UUT. The first functional module is adapted to generate or receive a test signal through a UUT interface. The first functional module has a network interface coupled to the network, which transfers data characterizing the test signal between the network and the first functional module. The test system also includes a plurality of second functional modules. Each second functional module includes data processing circuitry adapted to perform a function on the data characterizing the test signal generated or received by the at least one first functional module. The second functional modules have network interfaces coupled to the network that transmit or receive the data characterizing the at least one test signal over the network. Because of the network connection, any of the plurality of second function modules may exchange data with the at least one first functional module.

In another aspect, the invention relates to a method of operating an automatic test system of the type having a first functional module, a second functional module and a third functional module interconnected by a network. The method involves acquiring with the first functional module at least one analog signal from a unit under test and producing one or more digital outputs. Within each of the second functional module and the third functional module, at least one or more digital outputs is received over the network and processed. Processing in the third functional module is different than the processing in the second functional module.

In yet a further aspect, the invention relates to a method of operating a computing device to configure automatic test equipment to operate with a desired performance. As part of the method, network communication characteristics are provided in a format readable by the computing device each of a plurality of functional modules. A network configuration interconnecting the plurality of functional modules is specified in a format readable by the computing device. The computing device computes performance of the automatic test system with the specified network configuration and network communication characteristics. The computed performance is compared to the desired performance, and in response to the computed performance being less than the desired performance, modifying at least one of the functional modules in the plurality of functional modules and/or the specified network configuration.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

The inventors have appreciated that an improved test system may be constructed with virtual instruments. Each virtual instrument may be formed from one or more functional modules interconnected by a network. The functional modules may perform functions that are performed by a physical instrument in a conventional test system as it executes a test process.

Processes performed by a physical instrument in a conventional test system may be duplicated by the interconnected functional modules exchanging digital data over the network. Each functional module may have a network interface, allowing the functional modules to be interconnected over a common network. Consequently, the functional modules can be combined into virtual instruments, with some functional modules forming a part of more than one virtual instrument. Additionally, the combinations of functional modules may be changed by reprogramming network connections between functional modules.

Figure 1:
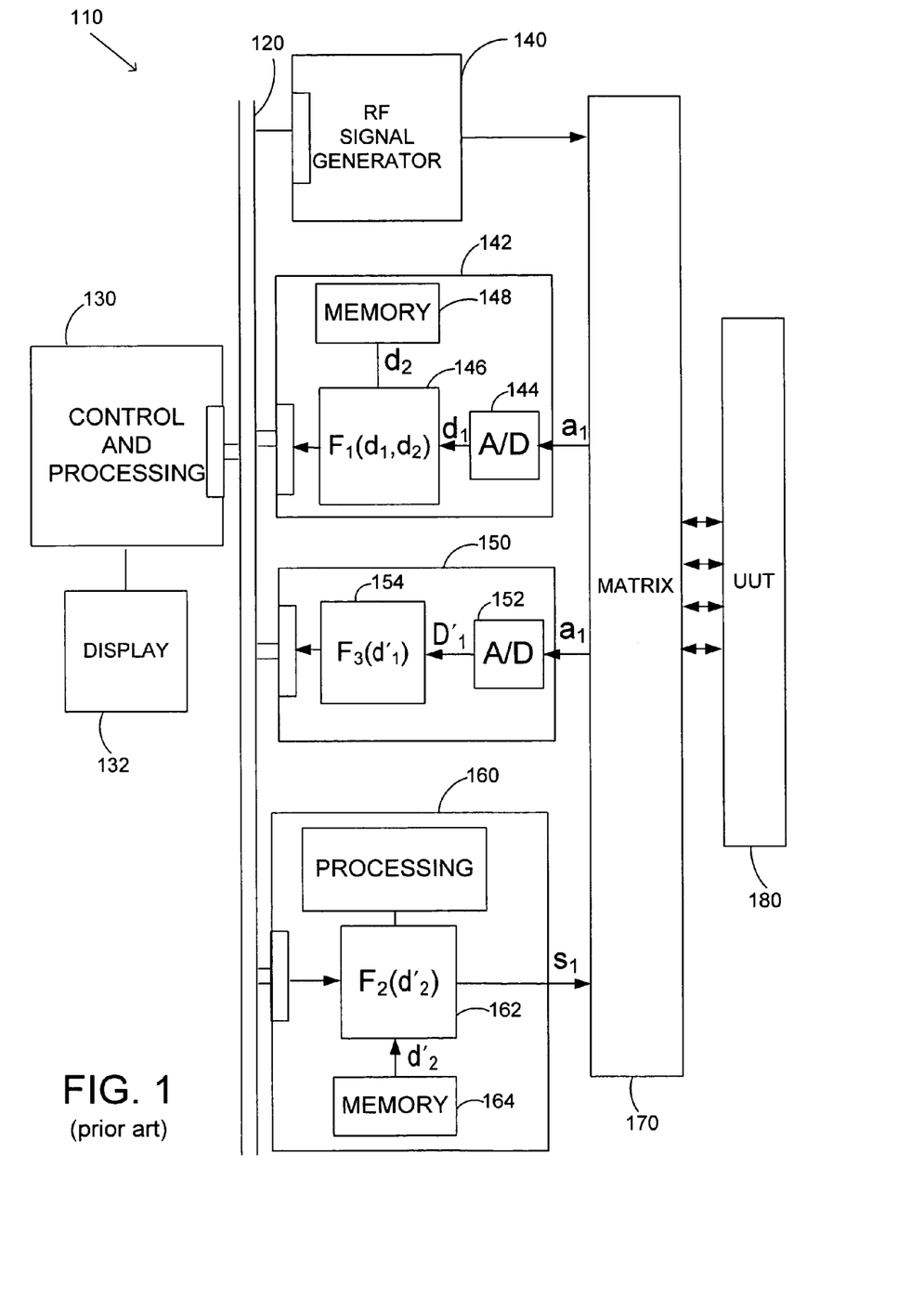
FIG. 1 is a block diagram of a prior art test system.

FIG. 1 illustrates a conventional test system 110 such as it is known in the art. Test system 110 generates and measures test signals applied to UUT 180.

Test system 110 includes multiple instruments, of which a signal generator 140, analog instrument 142, analog instrument 150 and digital instrument 160 are shown. The analog and digital instruments in test system 110 are controlled from control and processing unit 130. In test system 110, control and processing unit 130 may be a computer with a display 132 providing a user interface.

Control and processing unit 130 is connected to each of the instruments through a bus 120. In a conventional test system, the instruments are often mounted in a rack, a card cage or similar structure with a backplane or other mechanism to interconnect the instruments. Such as assemblies frequently use standardized buses, such as VXI, VME, GPBI or PXI buses or networks, such as Ethernet. These buses carry digital data, such as the results of analyzing measurements made on UUT 180 or command signals to the individual instruments. However, these buses generally are not regarded as providing real time control in the context of automatic test equipment. Rather, each of the instruments is generally regarded as a self-contained unit that performs a test process. Each instrument incorporates feedback paths or other components for real time control that are used in performance of the test process executed by the instrument.

Each of the instruments is coupled through switch matrix 170 to a test point on UUT 180. Switch matrix 170 can interconnect each of the instruments to test points on UUT 180 so that the test system 110 may be configured with the required instrument connected to each test point. If multiple processes are to be performed on the same signal, switch matrix 170 can connect multiple instruments to the same test point on UUT 180. For example, FIG. 1 shows analog instruments 142 and 150 both connected to receive analog signal $a_1$ from UUT 180. Each of the instruments is constructed to perform a test process. For example, RF signal generator 140 may generate an RF signal having characteristics, such as frequency and amplitude, specified by digital values communicated by control and processing unit 130 over bus 120.

Analog instrument 142 is an example of an instrument that performs a function on an analog signal $a_1$. In the simplified representation of FIG. 1, analog instrument 142 includes analog-to-digital converter (A/D) 144 that converts analog signal $a_1$ to a digital signal $d_1$. The digital signal $d_1$ is provided as an input to digital processing circuitry 146. A second digital input $d_2$ is provided to digital processing circuit 146 from memory 148. Digital processing circuit 146 performs a function on the digital inputs and outputs a result that may be used within control and processing unit 130 to determine whether UUT 180 responded as expected.

In the simplified block diagram of FIG. 1, the processing performed in digital processing circuit 146 is represented by the function $F_1$. Function $F_1$ may represent any function that may be performed by an analog instrument in a test system as part of the test process executed by the instrument. For example, function $F_1$ may represent a comparison function such that digital processing circuit 146 outputs a value indicating whether analog signal $a_1$ matches the signal represented by digital signal $d_2$ stored in memory 148.

Analog instrument 150 also includes an analog-to-digital converter (A/D) 152. In the configuration pictured in FIG. 1, A/D 152 also receives as an input analog signal $a_1$ Because analog instrument 150 receives as an input the same signal $a_1$ as analog instrument 142, A/D 152 outputs a digital signal $d'_1$ that is the same as the signal $d_1$ output by A\D 144 in analog instrument 142. Digital signal $d'_1$ is then provided as an input to digital processing circuit 154. In this example, digital processing circuit 154 implements a function $F_3$ on the digital signal $d'_1$. The function $F_3$ may represent any function performed by an analog instrument. For example, analog instrument 150 may measure a characteristic of analog signal $a_1$, such as its voltage or frequency. For such an instrument, digital processing circuit 154 processes the digital signal $d_1$ to determine the desired characteristic. Analog instrument 150 may then output that measured characteristic to control and processing unit 130 over bus 120.

Digital instrument 160 provides a further example of the types of physical instruments that have been included in prior art test systems. Digital instrument 160 includes digital processing circuit 162 that receives control signals from control and processing unit 130 over bus 120. In response to those control signals, digital processing circuit 162 may read a digital signal $d'_2$ from memory 164 and process $d'_2$ to generate a digital signal, $s_1$, applied to a test point on UUT 180 through switch matrix 170. Though digital signal $d'_2$ is used within digital instrument 160, it may have the same value as digital signal $d_2$ used with in analog instrument 142.

FIG. 1 illustrates attributes of conventional test systems that may be improved according to embodiments of the invention. For prior art test system 110 to perform different or additional functions, further analog or digital instruments may be added to test system 110 instead of or in addition to the instruments shown. Because each instrument is generally a self-contained unit that performs a process, the cost of adding an instrument may be relatively high and therefore undesirable. Further, because each instrument is designed to be self-contained, some instruments have components that duplicate functions performed in other instruments. For example, both analog instruments 142 and 150 contain circuitry that converts analog signal $a_1$ to a digital signal $d_1$.

Figure 2:
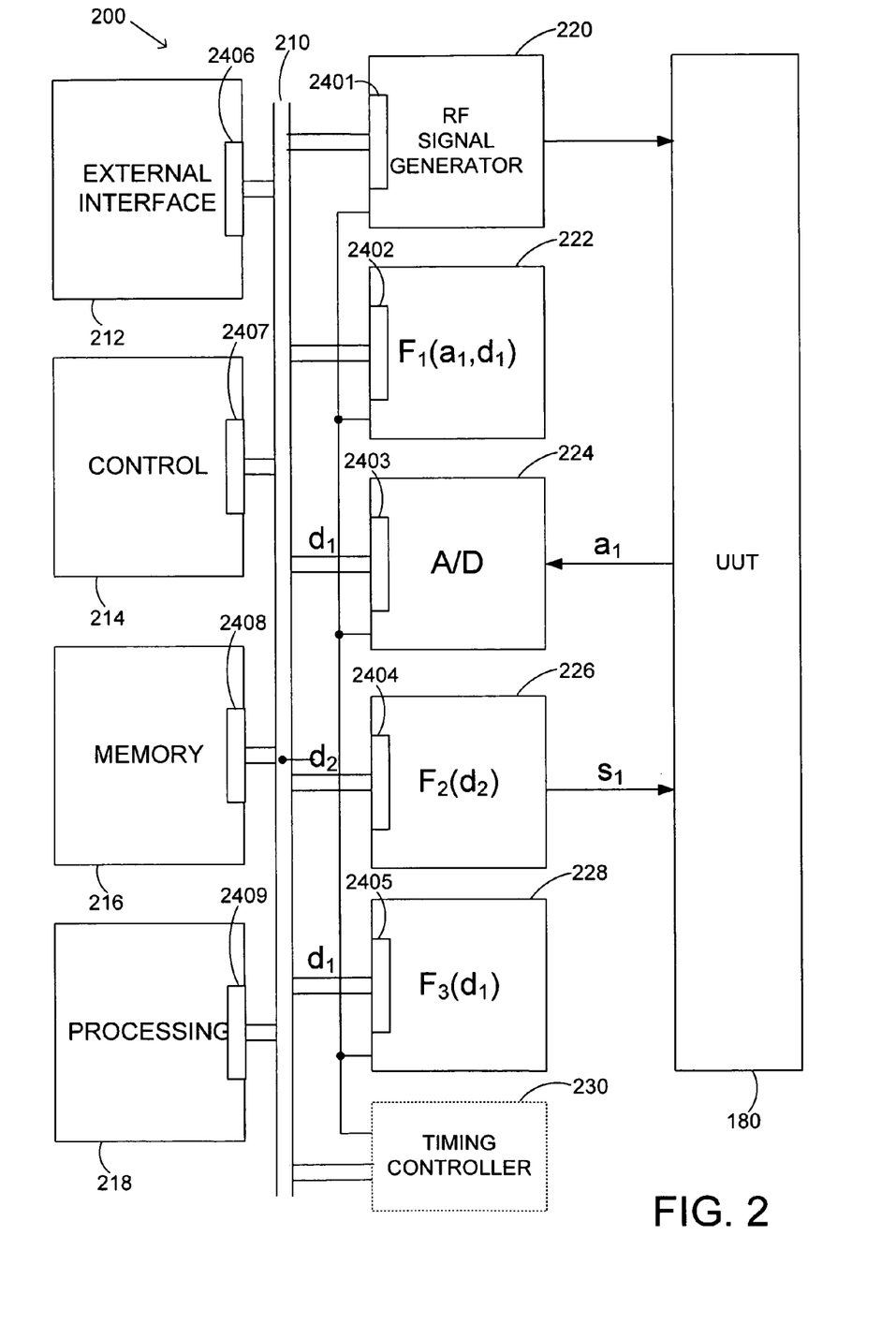
FIG. 2 is a block diagram of a test system according to an embodiment of the invention.

FIG. 2 shows a test system 200 that can be reconfigured to create "virtual instruments" that achieve the same effect of adding additional or different physical instruments without changing the underlying hardware. Test system 200 may also reduce the total amount of hardware required to implement multiple virtual instruments by allowing some circuitry to perform functions associated with multiple virtual instruments.

In test system 200, multiple functional modules are interconnected by a network 210. Network 210 may be any suitable network that allows functional modules to source and/or receive data on the network so that the functional modules can communicate over the network. Examples of suitable networks include Ethernet, Fibre Channel or 1394. In the illustration of FIG. 2, the network is shown as a multidrop network. However, the topology of network 210 is not a limitation of the invention. For example, a network with a hub and point-to-point connections may be used.

In the embodiment illustrated in FIG. 2, the functional modules include RF signal generator 220, functional module 222, analog-to-digital converter (A/D) 224, functional module 226 and functional module 228. Other functional modules include interface module 212, control module 214, memory module 216 and processing module 218.

In this example, RF signal generator 220 may be a signal generator that generates an RF signal in response to input parameters and may be similar to RF signal generator 140 (FIG. 1).

Functional modules 222, 226 and 228 may be modules that each performs a function associated with testing a unit. Because a test system may contain functional modules that perform any desired function, the functional modules are illustrated generally as performing functions $F_1$, $F_2$ and $F_3$. Functions $F_1$, $F_2$ and $F_3$ may represent any suitable functions relating to generating, measuring or analyzing a test signal.

A/D 224 may be an analog to digital converter as conventionally used in a test system, though any suitable device for producing a digital representation of an analog signal may be used. In the embodiment of FIG. 2, A/D 224 is connected to UUT 180 without the use of a switch matrix. In comparison to instruments that are larger and more costly because they contain data acquisition, signal generation and processing circuitry, there is less reason to switchably connect functional modules that perform only data acquisition or signal generation to UUT 180 through a switch matrix. Each test point may be connected to data acquisition or signal generation functional modules without the use of a switch matrix with little or no increase in the cost and size of the overall test system in comparison to a conventional system using instruments and a switch matrix. Constructing a test system without a switch matrix can simplify design and manufacture of a test system. Further, because a switch matrix can also be a source of signal distortion, constructing a test system without a switch matrix may improve signal integrity, thereby leading to more accurate testing. Of course, there are embodiments in which use of a switch matrix may be desirable, and the invention is not limited in this respect.

Control module 214 may be a computer workstation or other suitable device that may be programmed to provide control signals to functional modules such as 220, 222, 224, 226 and 228. For example, control module 214 may be programmed to perform any of the control functions of control and processing unit 130 (FIG. 1). In addition, control module 214 may be programmed to configure the functional units to exchange and process data to implement desired functions of test system 200.

External interface 212 may be a display such as is conventionally attached to a computer workstation or a printer. External interface 212 may serve the same function as display 132 (FIG. 1) or otherwise may enable interfacing to external devices or a human user in connection with receiving or providing information.

Test system 200 may also include memory module 216. Memory module 216 may be a memory module of any suitable construction. Because of the networked construction of tester 200, any of the functional modules may read or write data to memory module 216. Accordingly, memory module 216 may store any data used within the test system and may contain one or more types of computer memory, which could be volatile or non-volatile.

Test system 200 also includes a processing module 218. Processing module 218 may be any suitable processing module, such as a single board computer or an array processor. In the embodiment of FIG. 2, processing module 218 may be programmed to perform any desired processing on data received over network 210. For example, processing module 218 may be programmed to compute an FFT of a data series or may be programmed to perform correlation analysis on two signals.

The functional modules may be packaged in any suitable way. For example, they may be individual boards or assemblies in a test system. However, each module could be a chip on a board or provided in any other suitable way. Also, it is not necessary that every functional module be separated as shown. For example, in the embodiment of FIG. 2, interface 212, control module 214, memory module 216 and processing module 218 are shown as separate units. Each of these modules may be implemented as a separate board or other assembly inserted into a rack or card cage of suitable construction. However, because the units are interconnected through network 210, no specific physical configuration of the units is required. In some embodiments, some or all of the units, such as external interface 212, control module 214, memory module 216 and processing module 218, may be implemented in the same physical unit. For example, a computer workstation may provide an external interface, control, memory and processing capabilities and may be connected to network 210 through a single network interface.

For simplicity of illustration, FIG. 2 shows an embodiment with only functional modules used to implement processes performed by a test system configured with instruments as in FIG. 1. However, different or additional functional modules may be incorporated in test system 200.

Regardless of the number and type of functional modules included in test system 200, each of the functional modules includes a network interface $240_1 \ldots 240_9$. By interconnecting the functional modules through network 210, the functionality of any of the instruments in test system 110 may be duplicated.

Interconnections between functional modules may be provided in any suitable way. In the pictured embodiment, interconnections are provided through software programming of the network interfaces $240_1 \ldots 240_9$. For example each network interface may be programmed to implement one or more network connections, sessions or other form of association with another functional module. As a first functional module develops data used by a second functional module, the first functional module may transmit the data over the network using the association established with the second function module. The second functional module may monitor network for transmissions made through an association to which the second functional module belongs. The second functional module may then identify data it is to receive and process.

Network protocols that allow the creation of connections, sessions or other forms of associations are known. A known network protocol may be used to establish network paths between functional modules. However, any suitable network protocol may be used, including a custom protocol. Network protocols that support associations are frequently packet-based and may use header information transmitted with each packet to identify an association for a packet so that all modules connected to the network can identify specific packets to process.

In some embodiments, a packet-based network protocol that supports the creation of associations between functional modules is used on network 210 and interconnections between functional modules are defined by programming the functional modules to communicate using those associations. However, any suitable network protocol may be used.

Information on an association also may be used within a functional module receiving data over a network to determine how to process data in a packet once received. For example, functional module 222 is shown to receive two digital signals, $d_1$ and $d_2$. Functional module 222 may have at least two associations, one to receive digital signal $d_1$ and another to receive digital signal $d_2$. Network interface $240_2$ may be programmed to process data in packets associated with the digital signal $d_1$ differently than data in packets associated with digital signal $d_2$ so that these digital signals may be processed as required by other circuitry in functional module 222.

In operation, each of the functional modules may, based on programmed interconnections, receive information over network 210 used to control or execute functions of that module. Each module may also transmit over the network results of performing a function or may provide control information for other modules. In this way, functional modules may be interconnected in virtual instruments.

For example, RF signal generator 220 may receive control information through network interface $240_1$ specifying parameters of a signal to be generated. Parameters may, for example, specify the amplitude, frequency, modulation or other characteristics of a signal to be generated. The characteristics may be provided to RF signal generator 220 from control unit 214. However, because each of the units, such as interface 212, memory module 216 and processing module 218 are connected to RF signal generator 220 over network 210, parameters may be provided to the RF signal generator by any of these modules. Additionally, each of the functional modules 222, 224, 226 and 228 is also coupled to RF signal generator 220 over network 210. Accordingly, any of the functional modules may alternatively or additionally provide values to RF signal generator 220 specifying characteristics of the signal to be generated. At any given time, the specific functional module providing information to RF signal generator 220 may be specified by programming of network interconnections. Consequently, RF signal generator 220 on its own may act as an instrument or may be combined with other functional modules to act as a virtual instrument.

As another example, functional module 222 also receives values through interface $240_2$. In the embodiment illustrated, functional module 222 receives two inputs, which each may be a stream of digital values or information in any other suitable form. In the embodiment shown, functional module 222 receives digital signals $d_1$ and $d_2$ through network interface $240_2$. Functional module 222 is configured to perform a function $F_1$ on the input values $d_1$ and $d_2$. Function $F_1$ may represent one of the functions performed by instrument 142 (FIG. 1) or any other suitable function. For example, $F_1$ may be a correlation or comparison function. Functional module 222 may output the result of function $F_1$ over network 210 for use in another module or other modules connected to network 210.

In the embodiment of FIG. 2, the digital signals $d_1$ and $d_2$ processed in functional module 222 are obtained over network 210 from other functional modules. In test system 200, A/D 224 generates digital signal $d_1$ by digitizing an analog signal $a_1$ output by UUT 180. In the example illustrated, $d_2$ is read from memory module 216, which may be programmed in the same way as memory 148 (FIG. 1). In this way, functional module 222 receives as inputs signals that replicate the inputs to functional circuitry 146 (FIG. 1). Accordingly, though functional module 222 contains only a subset of the circuitry in analog instrument 142 (FIG. 1), functional module 222 may nonetheless be configured along with memory module 216 and A/D 224 as a virtual instrument that performs the same function as analog instrument 142.

FIG. 2 also provides an example of the flexibility of a networked test system implementing virtual instruments. Though A/D 224 provides signal $d_1$ to functional module 222, there is no physical constraint that restricts A/D 224 for use only in conjunction with that functional module. As a result, the digital signal $d_1$ output by A/D 224 may be readily used in other functional modules connected to network 210 to form different or additional virtual instruments. In the configuration shown in FIG. 2, functional module 228 also receives signal $d_1$ as an input. Accordingly, functional module 228 can perform a function $F_3$ on the digital signal $d_1$ to form a virtual instrument that provides an output comparable to that provided by analog instrument 150 (FIG. 1). However, functional module 228 has less circuitry than analog instrument 150 because it can receive an input signal $d_1$ over network 210 and does not require a dedicated A/D converter.

Similarly, functional module 226 may be part of a virtual instrument that generates a stimulus signal $s_1$ that is equivalent to the stimulus signal $s_1$ generated by digital instrument 160 (FIG. 1). However, functional module 226 may be implemented with less circuitry than instrument 160 because functional module 226 may receive inputs over network 210, limiting the amount of circuitry required in functional module 226 to generate signal $s_1$. For example, signal $d_2$ may be provided over network 210 by any other functional module in test system 200. In the example pictured, the function performed by digital instrument 160, is duplicated because functional module 226 receives signal $d_2$ over network 210 from memory 216. By storing the signal $d_2$ in memory 216, dedicated memory associated with functional module 226 is avoided. Additionally, functional module 226 requires the output of processing circuitry to generate signal $s_1$ as in digital instrument 160 (FIG. 1). Though functional module 226 is illustrated without such processing circuitry, functional module 226 may receive a processed output from processing unit 218 for use in generating $s_1$. To allow these modules to operate as a virtual instrument, network 210 may be configured to exchange information between these modules.

As the foregoing examples illustrate, test system 100 includes functional modules that collectively perform all of the functions performed during execution of test processes by tester 110. These functional modules can perform functions including those related to signal generation, signal capture, signal processing, other processing, control of the test system and interaction with a user. Network 210 may carry data and control information between any of the functional modules. By programming the functional modules to share data, the function of any instrument may be implemented in test system 200 by a combination of functional modules.

In some embodiments, network 210 may also be used to convey timing information between functional modules. Timing information may be conveyed as in conventional test systems operating under IEEE Standard 1588 or in any other suitable way. For example, each functional module may include a synchronized clock circuit that tracks time relative to a common reference time. Timing of events within test system 200 could therefore be achieved by transmitting event times as digital values on network 210. In other embodiments, test system 200 may include timing controller 230 that provides triggering signals to the functional modules at times when events are to occur.

Regardless of how timing information is conveyed to each of the functional modules, the functional modules collectively may receive data, control and timing information used to generate, measure and analyze test signals at UUT 180 in the same way as test system 110 (FIG. 1). However, the functions of test system 200 may be altered in a simple and low cost manner by reprogramming the manner in which network 210 interconnects the functional modules. In many instances, test system 200 may be reprogrammed to perform different or additional test processes without additional functional modules. Even in instances in which an additional functional module is added to test system 200 to perform an additional process for a test, the size and cost of a functional module may frequently be less than the size and cost of an entirely new instrument.

In the embodiment such as the embodiment of FIG. 2, real-time control of the virtual instruments is achieved with information passed over network 210. The performance of each virtual instrument may depend on how the network conveys information between functional modules. For example, in the embodiment of FIG. 2, all of the functional modules are interconnected through a network with a single segment. Accordingly, all of the functional modules may simultaneously compete for network bandwidth. If, at any time, the functional modules in the aggregate need to communicate an amount of information over network 210 that exceeds the network bandwidth, one or more of the functional modules may not receive either command or data information in time to perform a step of testing UUT 180. If such a condition were to arise, test system 200 may not perform an accurate test of UUT 180.

Figure 3:
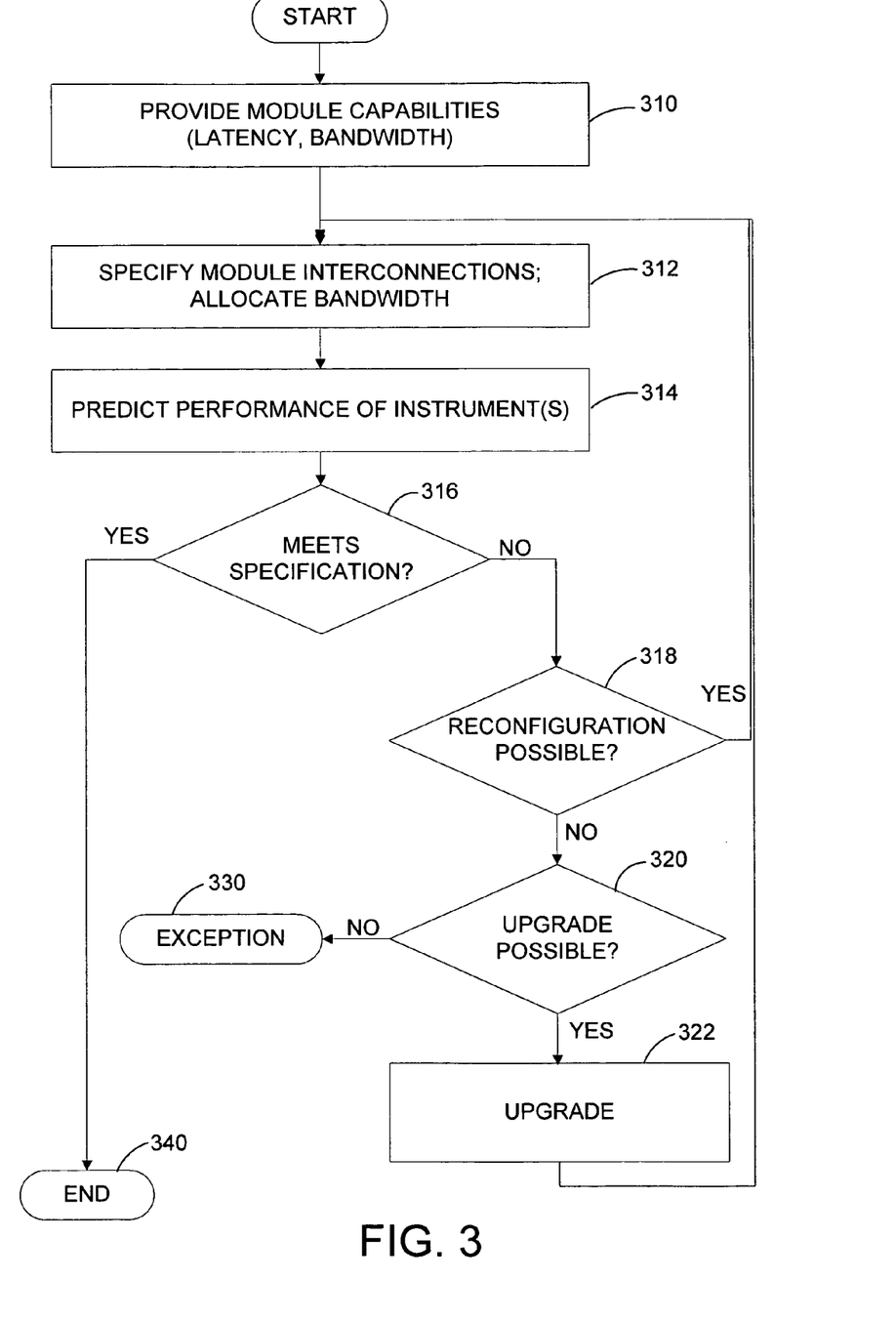
FIG. 3 is a flowchart illustrating a process of configuring a test system according to an embodiment of the invention.

To avoid inaccurate test results or other performance problems associated with a networked test system, a test system configured from multiple functional modules interconnected by a network may be constructed to ensure that processing errors are unlikely to occur based on the performance of network 210. FIG. 3 illustrates a process that may be performed as part of configuring a test system using multiple functional modules interconnected by a network with network interconnection characteristics likely to provide a desired level of performance. For example, each virtual instrument may have a set of performance specifications that are similar to those provided for physical instruments. The process of FIG. 3 may be used to identify a configuration of a networked test system that meets those performance specifications.

The process of FIG. 3 may be performed at any suitable time. For example, the process of FIG. 3 may be used at a factory when a test system is initially assembled for delivery to a user. Alternatively, a user of a test system may perform the process of FIG. 3 when programming a test system to perform tests on a specific UUT.

The process of FIG. 3 may be performed in any suitable way. In some embodiments, the process may be performed totally or partially by a computing device programmed to perform steps of the process.

The process of FIG. 3 begins at block 310 where module capabilities are provided. For computer implemented processing, the capabilities are input at block 310 to the computer. In some embodiments, the manufacturer of each functional module may provide information on the capabilities of the module. That information may be provided in any suitable way, including electronically on computer readable media or recorded on paper or other similar media. If provided electronically, processing at block 310 may include downloading or uploading the electronic data defining module capabilities into a computer performing steps of the process of FIG. 3. In other embodiments, processing at block 310 may involve a user of the computer entering, such as through a keyboard or other user interface, module capabilities.

Module capabilities provided at block 310 may include any capabilities useful in simulating the performance of the network of interconnected modules forming a configured test system. As one example, module capabilities may include an acceptable latency, i.e., an amount of time a module can operate properly without receiving data over the network or being able to transmit data over the network. The module capabilities may also include a bandwidth, indicating the average amount of data per unit time a module transmits and/or receives over a network. However, the specific module capabilities provided are not a limitation of the invention and different or additional capabilities may be specified.

Once module capabilities are provided, processing proceeds to block 312. At block 312, interconnection characteristics are specified. In the illustrated embodiment, the characteristics specified include physical interconnections between the functional modules. In the embodiment of FIG. 2, all of the functional modules are physically interconnected through network 210, which is shown with a single segment. This configuration represents one possible physical interconnection of functional modules. In other embodiments, physical interconnections between modules may be made with multiple network segments. The segments may be interconnected so that a module physically connected to one segment may communicate with modules connected to any other segment. However, modules physically connected to the same segment may exchange data over that segment without loading any other segment. Accordingly, in some embodiments, specification of interconnection characteristics at block 312 may involve specifying a number of network segments and the modules physically connected to each segment.

Though, different or additional characteristics may be specified at block 312. For example, some networks operate according to a protocol that allows bandwidth to be preferentially allocated for certain types of transmissions. In some embodiments network bandwidth may be expressly allocated a priori. As one example of an express allocation, a network protocol may specify that certain transmissions occur at certain intervals. The size of those intervals, the rate at which they recur and the amount of data transmitted during each such interval may all be specified as a way to allocate bandwidth. In other embodiments, network bandwidth may be allocated dynamically as functional modules communicate based on parameters specified in advance to prioritize certain types of transmissions. By assigning priorities to certain types of network transmissions or certain functional modules, the bandwidth allocation is changed.

If a bandwidth allocation has been supplied, the network protocol may specify operation of network interfaces such as $240_1 \ldots 240_9$ to ensure that those functional modules allocated additional bandwidth receive preferential access to the network, which can, in turn, alter the performance of virtual instruments containing those functional modules. Such preferential access, for example, may be used for data transmitted to or from functional modules that cannot tolerate high latency or that require large amounts of data. As a specific example, a functional module transmitting a real-time data signal, such as digital signal $d_1$ output by A/D 224, may be allocated more network bandwidth on network 210 than transmissions to or from a functional module, such as functional module 228, that analyzes data after it has been collected.

Interconnection characteristics may be specified at block 312 in any suitable way, including, for example, manually by a human or in an automated or semi-automated fashion by a computer programmed to implement steps of the process of FIG. 3. For example, when steps of the process of FIG. 3 are performed in a computer, processing at block 312 may involve a user specifying module interconnections graphically through a graphical user interface to that computer. Allocation of bandwidth at block 312 may also involve other forms of user input, such as inputting numeric values representing percentages of available network bandwidth that are allocated to specific types of network communications or transmission to or from specific functional modules.

Processing at blocks 310 and 312 results in characteristics of the functional modules in a test system and the network interconnecting those functional modules being available for use in simulating performance of a networked tester. The specific characteristics that may be specified at blocks 310 and 312 serve as examples of the types of data that may be used to simulate a networked test system. Different or additional information may be specified, depending on the configuration of the test system and the specific technology used to implement it. For example, if a test system may be implemented with a choice of networks, type, processing at block 310 or 312 may involve specifying the type to be used to interconnect the functional modules. Accordingly, the process of FIG. 3 is not limited to the specific example characteristics shown and may include receiving input specifying any characteristics of the functional modules, network or other aspects of the test system to be constructed.

Once information is provided on the network, functional modules and other characteristics of the test system to be configured, processing proceeds to block 314. At block 314, the performance of each of the virtual instruments created by interconnection of functional modules is computed. For example, FIG. 2 illustrates a virtual instrument formed by the output of A/D 224 being provided as an input to functional module 222 in conjunction with data retrieved from memory 216. The output of the virtual instrument is provided by functional module 222 to control module 214. The performance of those functional modules as interconnected may be simulated to determine one or more performance characteristic of the virtual instrument formed by the interconnection of those functional modules. For example, prediction of performance at block 314 may result in a computation of the maximum sustainable rate at which samples taken by A/D 224 may be communicated for processing in functional module 222, which can be used to indicate the data acquisition rate of the virtual instrument. As another example, a performance prediction at block 314 may involve computation of the latency between a sample taken at A/D 224 and the provision of an output to control module 214, which may be used to indicate latency of the virtual instrument.

The performance predictions made at block 314 may be made in any suitable way. In an embodiment in which functional modules of a test system are interconnected through a conventional network, commercially available network simulation software developed for that network may be used to predict performance of each of the virtual instruments. However, any other simulation technique or any suitable method may be used to predict performance of the virtual instruments.

Processing then proceeds to decision block 316. At decision block 316, the performance predictions at block 314 are compared to specifications for each of the virtual instruments. The performance specifications may be provided in any suitable way. For example, a test engineer may analyze units to be tested and craft a performance specification of instruments needed to generate, measure and analyze test signals that represent desired test conditions for the unit. The performance specifications may be stored in a database or other suitable data structure accessible to a computer programmed to perform steps in the process of FIG. 3. Though, in embodiments in which processing at decision block 316 is performed manually, the performance specifications may be stored in a human readable form. Accordingly, the manner in which the performance specifications are generated and stored is not a limitation on the invention and any suitable mechanism may be used.

Regardless of how the performance specifications are generated or stored, if the instruments meet the performance specifications set for a test system, processing may branch to termination point 340. If processing reaches termination point 340, the interconnection characteristics specified at block 314 may be used to interconnect functional modules as specified at block 310 to create a test system meeting the instrument specifications. Such a test system may then be configured by programming the functional modules of the test system to operate with the identified configuration.

Conversely, if as determined at decision block 316, one or more of the instruments does not meet the specifications, processing proceeds from decision block 316 to decision block 318. At decision block 318, a determination is made of whether a reconfiguration of the networked test system is possible.

The processing at decision block 318 may apply any suitable criteria to identify whether reconfiguration is possible. The test system can be reconfigured by changing any of the interconnection characteristics of the test system. For example, if the interconnection characteristics include bandwidth allocation, reconfiguration may be performed by changing that allocation. As another example, if all of the functional modules are connected with a single network segment, it may be possible to reconfigure the networked test system by providing multiple network segments, with a subset of the functional modules connected to each network segment.

Alternatively, if the networked test system is already configured with multiple network segments, it may be possible to further subdivide the network into additional segments. It also may be possible to reconfigure the test system by changing the allocation of functional modules to network segments. For example, two functional modules that exchange large amounts of data with each other, but not with other functional modules, may be assigned to a single network segment without other functional modules connected to that segment.

Regardless of the manner in which the network can be reconfigured, if reconfiguration is possible, processing loops back to block 312. At block 312, the interconnection characteristics specified are changed to indicate a reconfiguration of the networked test system.

New characteristics, representing a reconfiguration, may be generated in any suitable way. In some embodiments, the characteristics specified at block 312 may be changed randomly. In other embodiments, the interconnection characteristics specified at block 312 may be changed in an iterative process. In an iterative process, a new set of interconnection characteristics may be selected to reallocate network bandwidth from communications between modules interconnected in virtual instruments that meet their performance specifications to communication between modules interconnected in virtual instruments that do not meet their performance specifications. Similarly, the network segmentation may be changed to group functional modules forming a virtual instrument that does not meet performance specifications in single network segment and reducing the number of other functional modules connected to that segment.

Regardless of how the interconnection characteristics are specified at block 312, the process of FIG. 3 may loop through block 312, block 314, decision block 316 and decision block 318 until either interconnection characteristics are specified so that all virtual instruments meet the performance specification or no further reconfiguration is possible. If interconnection characteristics result in all of the virtual instruments meeting specification, processing branches from decision block 316 to termination point 340 for processing as described above.

If no interconnection characteristics can be identified that meet the performance specification, processing may branch from decision block 318 to decision block 320. At decision block 320, the process branches depending on whether upgrades are available for the networked test system.

In the illustrated embodiment, or "upgrade" may be an additional functional module that can be added to the test system. An "upgrade" may alternatively or additionally be a higher performance functional module that can replace a functional module already incorporated in the test system. For example, a functional module that can tolerate greater latency may be considered an upgrade for a functional module performing a similar function but is incapable of tolerating the higher latency. Alternatively, a functional module that can output data at a faster rate may be an upgrade for a module that performs a similar function but is limited in the rate at which it can provide data over network 210.

Regardless of the exact definition used for an upgrade, processing at decision block 320 may use any suitable criteria for determining whether an upgrade is possible. The criteria used may be technology related or business related. For example, an upgrade may be deemed to be possible if technology is available to construct a higher performance module. Alternatively, an upgrade may be deemed to be possible if a higher performing module is available at the site of the test system for use in the test system or if a higher performing module could be purchased or if the user is willing to purchase an upgraded module.

Regardless of the specific type of upgrades that are available or the specific definition of what upgrades are possible, if an upgrade is possible, processing proceeds to block 322. At block 322, the module capabilities as specified at block 310 are updated to reflect the upgraded functional module. Processing at block 322 may include specifying module capabilities for a newly added functional module or may include substituting module capabilities of a higher performing module for a lower performing module being replaced.

Once the performance characteristics are altered to reflect the upgrade, processing loops back to block 312 where interconnection characteristics are again specified. Processing then again loops through blocks 312 and 314 and decision block 316 and 318 until interconnection characteristics meeting the required specifications are identified or it is determined that no further reconfigurations of the networked test system are possible. If no reconfigurations are possible, processing will again proceed to decision block 320 where further upgrades may be identified. If no further upgrades are possible, the process will branch to termination point 330.

If processing reaches termination point 330, no interconnection characteristics can be identified to meet all performance specifications. The specific steps taken in response to reaching termination point 330 may depend on the intended application of the test system. In some instances, it may be acceptable to modify the desired specifications. In other instances, processing at termination point 330 may entail designing or otherwise identifying new functional modules. Alternatively, processing at termination point 330 may involve identifying a different type of network to use in constructing a test system from functional modules.

Figure 4:
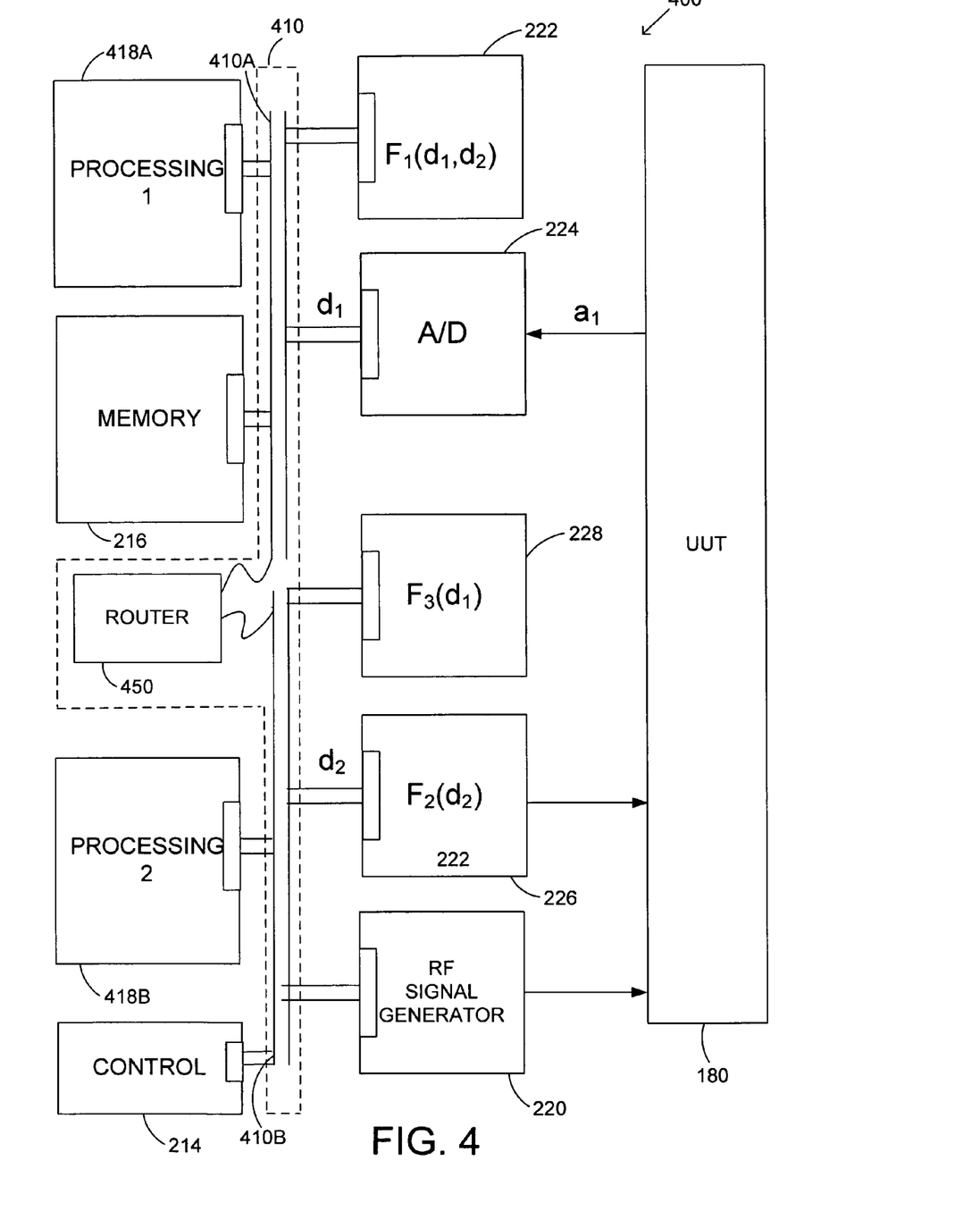
FIG. 4 is a block diagram of a test system according to an alternative embodiment of the invention.

Turning to FIG. 4 an alternative embodiment of a networked test system is shown as an example of a test system that may be constructed using a configuration identified by the process of FIG. 3. The embodiment of FIG. 4 may result from reconfiguring a test system according to the process of FIG. 3. However, the test system of FIG. 4 may be designed in any suitable way. Test system 400 includes a network 410 interconnecting multiple functional modules. In the embodiment pictured, test system 400 includes an RF signal generator 220, and functional modules 222, 224, 226 and 228 similar to functional modules in test system 200. In addition, test system 400 includes functional modules such as control module 214 and memory module 216.

In the embodiment of FIG. 4, network 410 has been configured with multiple segments, here illustrated as segments 410A and 410B. Separate processing units 418A and 418B are connected to network segments 410A and 410B, respectively. Functional modules 222, 224 and 228 are connected to network segment 410A. Functional module 226 and RF signal generator 220 are connected through module 410B.

With this configuration, information may pass between functional modules 222, 224 and 228, processing module 418A and memory 216 over network segment 410A without loading network segment 410B. Because the communications on network segment 410A do not load network segment 410B, data may pass between modules connected to network segment 410B, such as functional module 226, RF signal generator 220, processing module 410 and control module 214, without competing for network bandwidth with those modules interconnected on network segment 410A. Accordingly, the total bandwidth available for communications, such as between controller 214 and RF signal generator 220, is greater than if all of the functional modules of test system 400 were interconnected on the same network. Similarly, total bandwidth available for communications between A/D 224 and functional module 222 over network segment 410A is greater than if all of the functional modules of test system 400 were connected through the same network segment.

Despite the separate network segments in the configuration of FIG. 4, functional modules connected to one network segment may communicate with functional modules connected to another network segment. In the illustrated embodiment, a bridging device is incorporated in network 410 to allow data to pass between the network segments. In the example of FIG. 4, router 450 serves as a bridging device. Consequently, data may pass from a functional module connected on network segment 410A and a functional module connected on network segment 410B. For example, control module 214 may send a command to functional module 222.

FIG. 4 also illustrates one possible way in which an upgrade may be provided to a network test system. In test system 400, two processing modules, 418A and 418B are shown. Processing module 418A is connected to network segment 410A and processing module 418B is connected to network segment 410B. By upgrading test system 400 to include two processing modules, the rate at which data is processed may be increased. If a virtual instrument did not meet a specification because data was processed too slowly, adding an additional processing module coupled to other functional modules of that virtual instrument could increase the performance of the virtual instrument.

Alternatively, incorporating a second processing module may reduce the amount of data traveling over a network segment to a processing module. Thus, network bandwidth may be made available for transmission to or from other functional modules over that network segment, which may improve the overall system performance.

Figure 5:
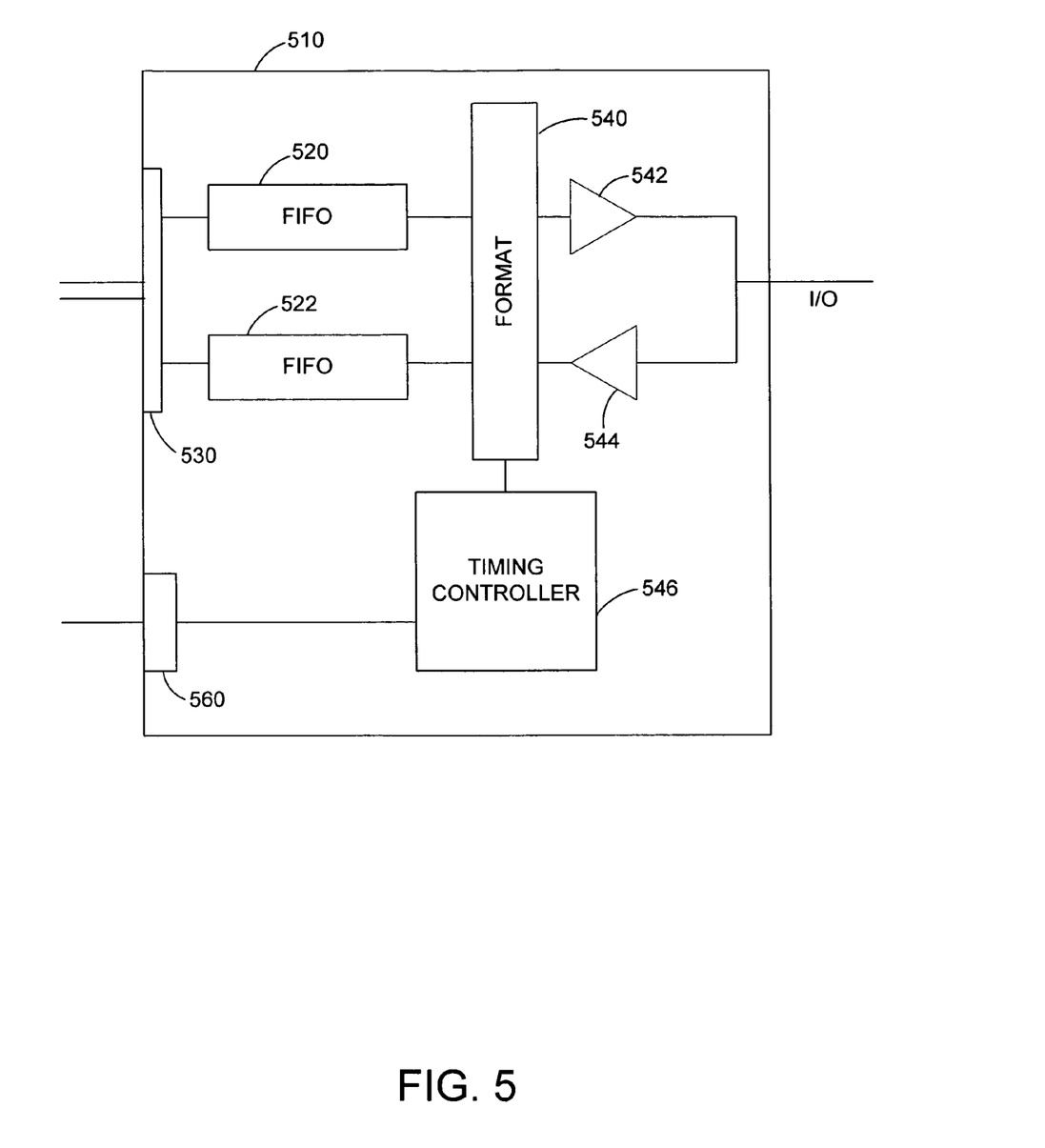
FIG. 5 is a sketch of a functional module according to an alternative embodiment of the invention.

FIG. 5 illustrates an embodiment of a functional module that may be used in a network test system such as test system 200 (FIG. 2) or test system 400 (FIG. 4). In the example of FIG. 5, the functional module is a digital instrument 510. In the illustrated embodiment, digital instrument 510 has an I/O line that may be connected to a digital test point on a unit under test. A test signal may be driven on the I/O line by driver 542 or sensed by receiver 544.

Format circuit 540 provides an input to driver 542, which specifies the signals for driver 542 to drive on the I/O line. Format circuit 540 receives an input from timing control circuit 546, such that formatter 540 specifies both values for the signals to drive and the times at which driver 542 should be active. Format circuit 540 also controls the recording of information from receiver 544 and can indicate whether the I/O line contains an expected value at an expected time.

Timing is provided by timing controller 546 that may be controlled through a separate timing interface 560. Signals provided by timing controller 546 may be in any suitable format. For example, timing controller 546 may output multiple signals that each trigger an event. These signals may be asserted periodically in a cyclical pattern to define cycles of operation of functional module 510.

The operation of format circuit 540 in each cycle of operation of digital instrument 510 may be specified by inputs to digital instrument 510 received over network interface 530. When digital instrument 510 is used in a networked test system, such as test system 200 or test system 400, the inputs received through network interface 530 may be generated by any other functional module.

Received inputs may be stored in FIFO 520. Format circuit 540 may read one value from FIFO 520 for each cycle of operation. FIFO 520 may compensate for variability in transmission of data over a network to which digital instrument 510 is connected. During some intervals, digital instrument 510 may receive data at a rate faster than format circuit 540 uses it. In those intervals, the data is buffered in FIFO 520 until format circuit 540 uses it. In other intervals, digital instrument 510 may receive data at a slower rate than format circuit 540 uses it. In those intervals, format circuit 540 may nonetheless have data for each cycle because data values can be read from FIFO 520.

Similarly, FIFO 522 may serve as a buffer for outputs generated by format circuit 540. As format circuit 540 generates outputs, they are stored in FIFO 522. If network bandwidth is available for transmission of those outputs, the outputs will be transmitted from FIFO 522 through network interface 530. However, during intervals in which network bandwidth is not available, outgoing data generated by format circuit 540 will be buffered in FIFO 522 until the data can be transmitted over the network.

FIG. 5 illustrates how bandwidth and latency requirements impact the performance of a functional module. Format circuit 540 reads data from FIFO 520 at a rate that allows a value to be driven or received on the I/O line at periodic intervals. Similarly, format circuit 540 may provide a value to FIFO 522 at a rate consistent with the rate at which values on the I/O line are sampled. The combined rate at which format circuit reads data from FIFO 520 and writes data to FIFO 522 may be taken as an indication of the bandwidth required by digital instrument 510.

The length of FIFOs 520 and 522 provide an indication of the latency that digital instrument 510 can tolerate. If propagation delays over a network to which digital instrument 510 is connected prevent data from being added to FIFO 520 during an interval that is sufficiently long that FIFO 520 will run out of data, format circuit 540 will lack data to operate in a cycle. The amount of time that digital instrument 510 can operate without new data being added to FIFO 520 is one indication that the maximum latency that digital instrument 510 can tolerate. Similarly, if delays in network transmission preclude data from being read from FIFO 522 for an extended period of time, format circuit 540 will generate more data than FIFO 522 can store. If this condition occurs, some data generated by format circuit 540 will be lost. Accordingly, the length of time that digital instrument 510 can operate without data being removed from FIFO 522 provides another indication of the amount of latency that digital instrument 510 can tolerate.

Making FIFOs 520 and 522 larger is one way to increase the tolerable latency for digital instrument 510. Increasing FIFO length is one example of a method to construct higher performing instruments for an upgrade of a functional module. However, any suitable method for increasing the performance of a functional module may be used to provide an upgrade.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface including keyboards, and pointing devices, such as mice, touch pads, and digitizing tables. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or conventional programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An automatic test system for testing a unit under test (UUT), comprising:
    a) a network;
    b) a first functional module coupled to the network and to the UUT, wherein the first functional module comprises an analog-to-digital converter comprising:
        i) a UUT interface coupled to the UUT, the first functional module being adapted to receive an analog test signal through the UUT interface as part of a test of the UUT and convert the analog test signal into data comprising a digital representation of the analog test signal; and
        ii) a network interface coupled to the network, the network interface being adapted to transfer the data between the network and the first functional module;
    c) a plurality of second functional modules interconnected with the first functional module via the network to form one or more virtual instruments, each of the plurality of second functional modules comprising:
        i) data processing circuitry adapted to perform a function on the data; and
        ii) a network interface coupled to the network, the network interface being adapted to receive over the network the data from the first functional module,
    whereby any of the plurality of second functional modules may receive the data from the first functional module via the network interface of the second functional module.

2. The automatic test system of claim 1, wherein the network operates according to a standardized protocol.

3. The automatic test system of claim 2, wherein the network operates according to a standardized protocol selected from the group consisting of PCI Express, Fibre Channel, IEEE Standard 1394 and Ethernet.

4. The automatic test system of claim 1, wherein the data comprises a stream of digital values.

5. The automatic test system of claim 4, wherein the first functional module and a functional module of the plurality of second functional modules form a digital meter.

6. The automatic test system of claim 4, wherein the first functional module and a functional module of the plurality of second functional modules comprise a scope.

7. The automatic test system of claim 4, wherein the first functional module and a functional module of the plurality of second functional modules comprise a timing trigger.

8. The automatic test system of claim 1, further comprising a bridging element interconnecting a first network segment of the network and a second network segment of the network.

9. The automatic test system of claim 8, wherein the analog test signal is a first test signal, and wherein the automatic test system further comprises a third functional module coupled to the network and to the UUT, the third functional module comprising:

i) a UUT interface coupled to the UUT, the third functional module being adapted to generate or receive a second test signal through the UUT interface; and
ii) a network interface coupled to the network, the network interface being adapted to transfer data characterizing the second test signal between the network and the third functional module;

wherein the network provides a first network path between the first functional module and a first of the plurality of second functional modules through the first network segment and a second network path between the third functional module and a second of the plurality of second functional modules through the second network segment.

10. A method of operating an automatic test system of the type having a first functional module, a second functional module and a third functional module interconnected by a network, the method comprising:
  a) acquiring with the first functional module at least one analog signal from a unit under test as part of a test of the UUT and producing one or more digital outputs, the one or more digital outputs resulting at least in part from performance of a function by the first functional module on the analog signal acquired from the UUT;
  b) within each of the second functional module and the third functional module:
    i) receiving over the network at least one digital output of the one or more digital outputs; and
    ii) processing the at least one digital output,
      the processing in the third functional module being different than the processing in the second functional module and wherein the processing in the third functional module comprises performing a comparison function between the at least one digital output received from the first functional module and a second digital signal.

11. The method of claim 10, wherein receiving over the network at least one digital output comprises receiving a stream of digital values over the network, the network operating according to a standardized protocol selected from the group consisting of PCI Express, Fibre Channel, IEEE Standard 1394 and Ethernet.

12. The method of claim 10, wherein processing the at least one digital output comprises producing a measurement of a voltage level of the at least one analog signal.

13. The method of claim 10, wherein processing the at least one digital output comprises displaying a trace of the at least one digital output.

14. A method of manufacturing a test system using a method of operating a computing device to configure automatic test equipment to operate with a desired performance, the method of manufacturing the test system comprising the acts:
  i) determining a configuration of the test system according to the method of operating the computing device, the method of operating the computing device comprising the acts:
    a) providing, in a format readable by the computing device, network communication characteristics for each of a plurality of functional modules;
    b) specifying, in a format readable by the computing device, a network configuration interconnecting the plurality of functional modules;
    c) computing, in the computing device, performance of the automatic test system with the specified network configuration and the network communication characteristics;
    d) comparing the computed performance to the desired performance; and
    e) in response to the computed performance being less than the desired performance, modifying:
      1. at least one of the functional modules in the plurality of functional modules; or
      2. the specified network configuration; or
      3. at least one of the functional modules in the plurality of functional modules and the specified network configuration; and
  ii) constructing the test system according with the configuration determined in (i).

15. The method of claim 14, wherein the act e) comprises modifying the specified network configuration to comprise a plurality of network segments, each segment interconnecting a subset of the plurality of functional modules.

16. The method of claim 14, wherein the act e) comprises modifying the specified network configuration to provide a different allocation of network bandwidth to paths interconnecting the plurality of functional modules.

17. The method of claim 14, wherein the act e) comprises replacing a functional module of the plurality of functional modules with an upgraded functional module.

18. The method of claim 14, wherein the act a) comprises defining an interface to each of the plurality of functional modules, each interface definition including bandwidth and latency requirements.

19. The method of claim 14, wherein the method of operating the computing device further comprises the act:
  f) repeating the acts a, b, c, d, and e until the computed performance equals or exceeds the desired performance.

20. The automatic test system of claim 1, wherein the network is a packet-switched network and wherein the plurality of second functional modules communicate by exchanging packets of information.

21. The automatic test system of claim 1, wherein the plurality of second functional modules comprises at least two second functional modules, and wherein a first of the plurality of second functional modules comprises a radiofrequency (RF) signal generator.

22. The automatic test system of claim 1, wherein the first functional module is coupled to the UUT in a manner other than via a switch matrix.

23. The automatic test system of claim 1, wherein the first functional module constitutes a first chip and wherein at least one of the plurality of second functional modules constitutes a second chip.

* * * * *